US012776788B2

(12) United States Patent
Jang et al.

(10) Patent No.: US 12,776,788 B2
(45) Date of Patent: Oct. 27, 2026

(54) MACHINE LEARNING ACCELERATOR, COMPUTING DEVICE INCLUDING MACHINE LEARNING ACCELERATOR, AND METHOD OF LOADING DATA TO MACHINE LEARNING ACCELERATOR

(71) Applicant: Samsung Electronics Co., Ltd., Suwon-si (KR)

(72) Inventors: Jae Hun Jang, Suwon-si (KR); Younho Jeon, Suwon-si (KR); Gitae Na, Suwon-si (KR); Hong Rak Son, Suwon-si (KR); Dong-Min Shin, Suwon-si (KR); Hwang Lee, Suwon-si (KR); Sejung Kwon, Seongnam-si (KR); Byeonguk Kim, Seongnam-si (KR); Baeseong Park, Seongnam-si (KR); Jiwon Ryu, Seongnam-si (KR); Dongsoo Lee, Seongnam-si (KR)

(73) Assignees: Samsung Electronics Co., Ltd., Suwon-si (KR); NAVER CORPORATION, Seongnam-si (KR)

( * ) Notice: Subject to any disclaimer, the term of this patent is extended or adjusted under 35 U.S.C. 154(b) by 89 days.

(21) Appl. No.: 19/018,375

(22) Filed: Jan. 13, 2025

(65) Prior Publication Data

US 2025/0240031 A1 Jul. 24, 2025

(30) Foreign Application Priority Data

Jan. 24, 2024 (KR) ........................ 10-2024-0011143

(51) Int. Cl.
*H03M 7/30* (2006.01)
*H03M 7/02* (2006.01)
(Continued)

(52) U.S. Cl.
CPC ........... *H03M 7/6005* (2013.01); *H03M 7/02* (2013.01); *G06F 3/06* (2013.01); *G06N 3/02* (2013.01); *G06N 3/04* (2013.01)

(58) Field of Classification Search
CPC ........ H03M 7/6005; H03M 7/02; G06N 3/04; G06N 3/02; G06F 3/06
See application file for complete search history.

(56) References Cited

U.S. PATENT DOCUMENTS 10,546,393 B2 1/2020 Ray et al.
11,632,129 B2 4/2023 Kim
(Continued)

FOREIGN PATENT DOCUMENTS

CN 111047020 A 4/2020

OTHER PUBLICATIONS

Extended European Search Report in European Appln. No. 25152044.1, mailed on Jun. 27, 2025, 11 pages.
(Continued)

*Primary Examiner* — Joseph J Lauture
(74) *Attorney, Agent, or Firm* — Fish & Richardson P.C.

(57) ABSTRACT

Disclosed is a machine learning accelerator which includes a first data controller that stores original length information indicating an original length, receives first data with a first length, and decompresses the first data with the first length to output second data with the original length, a second data controller that stores the original length information, receives third data with a second length shorter than the first length, and decompresses the third data with the second length to output fourth data with the original length, a first accelerator core that receives the second data with the original length from the first data controller and performs a first machine learning-based operation, and a second accelerator core that receives the fourth data with the original
(Continued)

length from the second data controller and performs a second machine learning-based operation.

20 Claims, 14 Drawing Sheets

(51) Int. Cl.

| | |
|---|---|
| *G06F 3/06* | (2006.01) |
| *G06N 3/02* | (2006.01) |
| *G06N 3/04* | (2023.01) |

(56) References Cited

U.S. PATENT DOCUMENTS

| | | | |
|---|---|---|---|
| 11,669,736 | B2 | 6/2023 | Brothers, III |
| 11,704,535 | B1 * | 7/2023 | Vemuri ................. G06F 3/0655 706/31 |
| 2006/0080478 | A1 | 4/2006 | Seigneret et al. |
| 2018/0082181 | A1 | 3/2018 | Brothers et al. |
| 2021/0287074 | A1 | 9/2021 | Coenen |
| 2021/0326144 | A1 | 10/2021 | Raha et al. |
| 2022/0318604 | A1 | 10/2022 | Xu et al. |
| 2022/0398441 | A1 | 12/2022 | Terashima et al. |
| 2023/0059970 | A1 | 2/2023 | Quesada et al. |

OTHER PUBLICATIONS

Li et al., "RRAM-DNN: An RRAM and Model-Compression Empowered All-Weights-On-Chip DNN Accelerator," IEEE Journal of Solid-State Circuits, Apr. 2021, 56(4):1105-1115.

* cited by examiner

MACHINE LEARNING ACCELERATOR, COMPUTING DEVICE INCLUDING MACHINE LEARNING ACCELERATOR, AND METHOD OF LOADING DATA TO MACHINE LEARNING ACCELERATOR

CROSS-REFERENCE TO RELATED APPLICATIONS

This application claims priority under 35 U.S.C. § 119 to Korean Patent Application No. 10-2024-0011143 filed on Jan. 24, 2024, in the Korean Intellectual Property Office, the disclosures of which are incorporated by reference herein in their entireties.

BACKGROUND

Embodiments of the present disclosure described herein relate to an electronic device, and more particularly, relate to a machine learning accelerator with an improved data loading speed, a computing device including the machine learning accelerator, and a method of loading data to the machine learning accelerator.

A machine learning accelerator is configured to load weight data and to perform a machine learning-based operation. With the development of technologies for machine learning, the capacity of data loaded to the machine learning accelerator is increasing. Accordingly, a time taken to load weight data to the machine learning accelerator is also increasing.

The weight data may be compressed to decrease the time taken to load the weight data to the machine learning accelerator. The compressed weight data may be transferred to the machine learning accelerator during a shorter time.

SUMMARY

Embodiments of the present disclosure provide a machine learning accelerator capable of loading compressed weight data during a shorter time, a computing device including the machine learning accelerator, and a method of loading data to the machine learning accelerator.

According to at least one embodiment, a machine learning accelerator a first data controller configured to store original length information indicating an original length for data, to receive first data with a first length, to generate second data having the original length by decompressing the first data with the first length, and to output the second data having the original length; a second data controller configured to store the original length information, to receive third data with a second length shorter than the first length, to generate fourth data having the original length by decompressing the third data with the second length, and to output the fourth data having the original length; a first accelerator core configured to receive the second data having the original length and to perform a first machine learning-based operation using the second data as first weight data; and a second accelerator core configured to receive the fourth data having the original length and to perform a second machine learning-based operation using the fourth data as second weight data, wherein each of the first data controller and the second data controller is configured to monitor a timing at which decompression is completed, based on the original length, and terminate the decompression at the timing at which the decompression is completed.

According to at least one embodiment, a computing device includes a memory configured to store first data with a first length and second data with a second length shorter than the first length; and a machine learning accelerator configured to receive the first data and third data from the memory, the third data having the first length and including the second data, wherein the machine learning accelerator is configured to generate first weight data by decompressing the first data with the first length, convert the third data with the first length into the second data with the second length, generate second weight data by decompressing the second data with the second length, and perform a machine learning-based operation based on the first weight data and the second weight data.

According to at least one embodiment, a method in which a processor loads data to a machine learning accelerator includes simultaneously programming, at the processor, two or more direct memory access (DMA) masters using a first start address and first length information; and reading, at the two or more DMA masters, data from a memory in parallel based on the first start address and the first length information and transferring the data read in parallel to the machine learning accelerator, wherein the machine learning accelerator is configured to generate first weight data by decompressing first data corresponding to the first length information from among the data read in parallel, generate third data with a second length by converting second data corresponding to the first length information, the second length being shorter than a first length indicated by the first length information, generate second weight data by decompressing the third data with the second length, and perform a machine learning-based operation based on the first weight data and the second weight data.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that an ordinary one in the art easily carries out the present disclosure.

Figure 1:
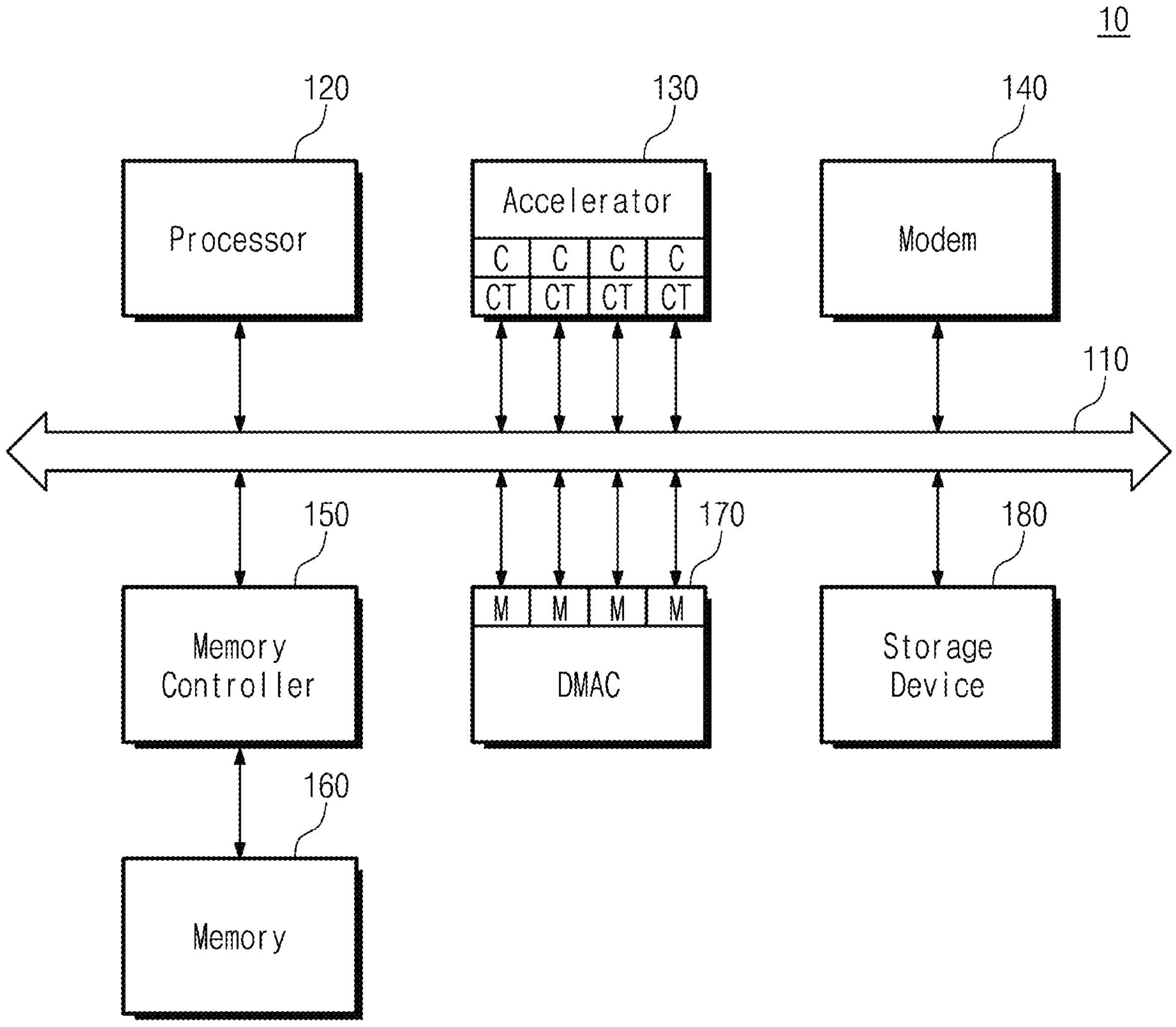
FIG. 1 illustrates a computing device according to at least one embodiment of the present disclosure.

FIG. 1 illustrates a computing device 10 according to at least one embodiment of the present disclosure. Referring to FIG. 1, the computing device 10 may include a system bus 110, a processor 120, an accelerator 130, a modem 140, a memory controller 150, a memory 160, a direct memory access controller (DMAC) 170, and a storage device 180.

The system bus 110 may be configured to enable communication between the components of the computing device 10, e.g., by providing channels between the components of the computing device 10. For example, the system bus 110 may provide the channels based on one or more of various communication protocols such as peripheral component interconnect express (PCIe), non-volatile memory express (NVMe), a dual in-line memory module (DIMM), an advanced extensible interface (AXI), and/or the like.

The processor 120 may be configured to execute an operating system and various applications. The processor 120 may be configured to control the components of the computing device 10 depending on requests of the operating system and the applications. For example, the processor 120 may include a central processing unit (CPU) and/or an application processor (CP) which includes one or more processing cores.

The accelerator 130 may be a machine learning accelerator which runs a machine learning module trained based on machine learning or a trained machine learning module. For example, the machine learning may be based on various algorithms including a convolutional neural network (CNN), a deep NN (DNN), and a generative adversarial network (GAN). In at least some embodiments, for example, the trained machine learning module may be configured to perform voice recognition, text-to-speech, image recognition, image classification, and/or image processing by using a neural network, a tablet device, a smart TV, an augmented reality (AR) device, an Internet of things (IoT) device, a self-driving vehicle, robots, a medical device, a drone, an advanced drivers assistance system (ADAS), an image display device, a data processing server, a measuring device, etc. and/or may be mounted in one of various kinds of electronic devices.

The accelerator 130 may include a plurality of accelerator cores "C". In the at least one embodiment, the accelerator 130 may include four accelerator cores "C". The accelerator cores "C" may be configured to operate in parallel to perform a machine learning operation. The machine learning operation may include at least some of various operations of the machine learning module, such as learning, inference, and/or classification.

The accelerator 130 may include data controllers CT respectively corresponding to the accelerator cores "C". For example, the accelerator 130 may include four data controllers CT. The data controllers CT may be configured to operate in parallel. The data controllers CT may decompress the compressed data transferred to the accelerator 130 and may transfer the decompressed data to the corresponding accelerator core "C". The data controllers CT may also provide uncompressed data transferred to the accelerator 130 to the accelerator cores "C"

The modem 140 may be configured to communicate with an external device. For example, the modem 140 may communicate with the external device based on various wired and/or wireless communication protocols such as IEEE 802.11, Ethernet, 5G, and Bluetooth. The modem 140 may transmit data stored in the memory 160 to the external device or may store data transmitted from the external device to the modem 140.

The memory controller 150 may be configured to access the memory 160. For example, the memory controller 150 may access the memory 160 depending on a request of the processor 120 and/or the DMAC 170. For example, the memory controller 150 may write data in the memory 160 or may read data from the memory 160. The memory controller 150 may perform various operations for managing the data stored in the memory 160, for example, various background operations including a refresh operation and a row hammering prevention operation.

The memory 160 may be a random access memory. For example, the memory 160 may be implemented with one or more of various random access memories such as a dynamic random access memory (DRAM), a static RAM (SRAM), a phase-change RAM (PRAM), a magnetic RAM (MRAM), a ferroelectric RAM (FRAM), a resistive RAM (RRAM), and/or the like.

The DMAC 170 may be configured to request the memory controller 150 to write data output from at least one of the computing device 10 in the memory 160, in compliance with the program of the processor 120. For example, the DMAC 170 may request the memory controller 150 to output the data stored in the memory 160 to at least one of the components of the computing device 10, in compliance with the program of the processor 120. The DMAC 170 may include a plurality of DMA masters "M". In at least one embodiment, the DMAC 170 may include four DMA masters "M". The DMA masters "M" may request the access to the memory 160, for example, a read operation or a write operation from the memory controller 150 independently of each other.

In at least one embodiment, the DMA masters "M" may request the read or write operation of the memory 160 from the memory controller 150 in parallel, independently, or simultaneously. Depending on requests of the DMA masters "M", the memory controller 150 may perform the write operations or the read operations on the memory 160 in parallel, independently, or simultaneously. For example, a plurality of channels may be provided between the DMA masters "M" and the memory controller 150 in parallel, independently, or simultaneously. Also, a plurality of channels may be provided between the memory controller 150 and the memory 160 in parallel, independently, or simultaneously.

The storage device 180 may be an auxiliary memory device of the computing device 10. For example, the storage device 180 may be a hard disk drive (HDD), a solid state drive (SSD), an embedded storage device, and/or the like.

Figure 2:
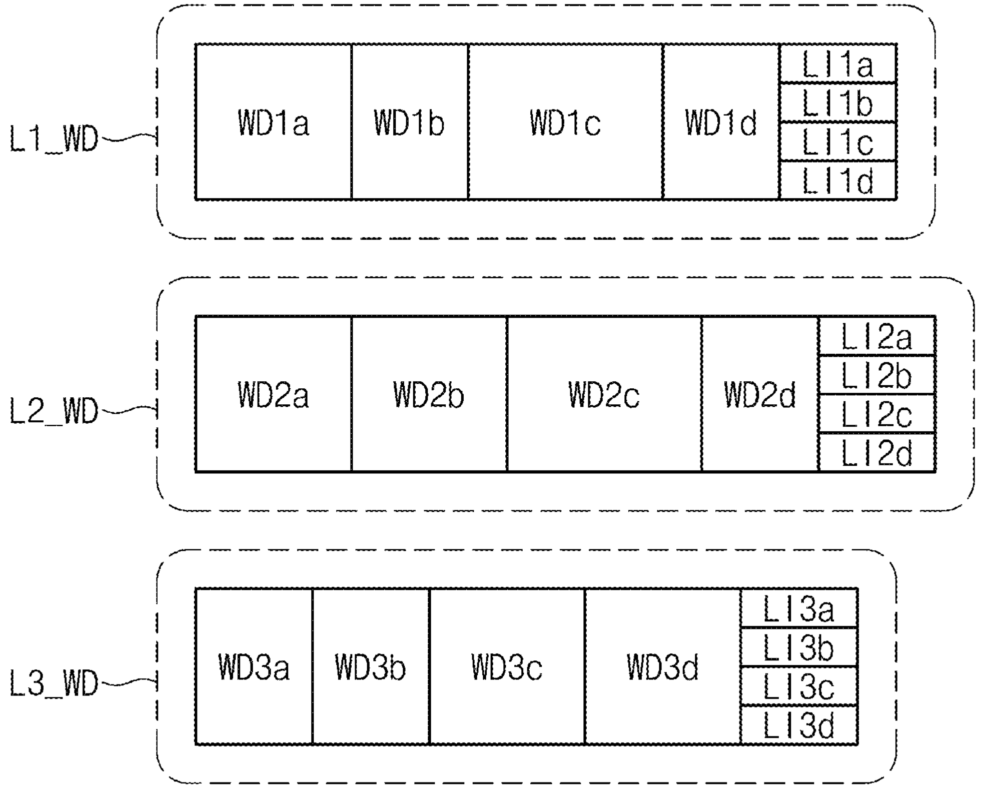
FIG. 2 illustrates examples of a compressed form of weight data loaded to an accelerator.

FIG. 2 illustrates examples of a compressed form of weight data (e.g., compressed weight data) loaded to the accelerator 130. Referring to FIGS. 1 and 2, in at least one embodiment, the accelerator 130 may run the machine learning module including three layers. Further, though first through third compressed weight data L1_WD through L3_WD (corresponding to the three layers) are illustrated, the examples are not limited thereto. For example, in at least one embodiment, the number of layers may be less than or greater than three, and the number of compressed weight data may correspond to the number of layers included in the machine learning module.

First compressed layer weight data L1_WD may be compressed weight data to be used in the first layer of the machine learning module. The first compressed layer weight data L1_WD may include 1a-th compressed weight data WD1*a*, 1b-th compressed weight data WD1*b*, 1c-th compressed weight data WD1*c*, and 1d-th compressed weight data WD1*d* respectively corresponding to the four accelerator cores "C".

Second compressed layer weight data L2_WD may be compressed weight data to be used in the second layer of the machine learning module. The second compressed layer weight data L2_WD may include 2a-th compressed weight data WD2*a*, 2b-th compressed weight data WD2*b*, 2c-th compressed weight data WD2*c*, and 2d-th compressed weight data WD2*d* respectively corresponding to the four accelerator cores "C".

Third compressed layer weight data L3_WD may be compressed weight data to be used in the third layer of the machine learning module. The third compressed layer weight data L3_WD may include 3a-th compressed weight data WD3*a*, 3b-th compressed weight data WD3*b*, 3c-th compressed weight data WD3*c*, and 3d-th compressed weight data WD3*d* respectively corresponding to the four accelerator cores "C".

In at least one embodiment, a compression ratio may vary depending on a pattern of weight data. As a difference between a ratio of 0's of weight data and a ratio of 1's of weight data decreases, a compression ratio of weight data may decrease. As a difference between a ratio of 0's of weight data and a ratio of 1's of weight data increases, a compression ratio of weight data may increase. As values of "0" or "1" are focused and placed in weight data, a compression ratio of weight data may increase. As values of "0" or "1" are distributed and placed in weight data, a compression ratio of weight data may decrease.

When weight data have different compression ratios, the compressed weight data may have different sizes. Examples in which compressed weight data have different sizes are illustrated in FIG. 2.

The first compressed layer weight data L1_WD, the second compressed layer weight data L2_WD, and the third compressed layer weight data L3_WD may be stored in the storage device 180. For example, the first compressed layer weight data L1_WD, the second compressed layer weight data L2_WD, and the third compressed layer weight data L3_WD may be acquired and stored in the memory 160 (e.g., through the modem 140 from an external device) and/or may be stored in the storage device 180. As another example, the first compressed layer weight data L1_WD, the second compressed layer weight data L2_WD, and the third compressed layer weight data L3_WD may be stored in a removable storage device, and the removable storage device may be connected to the computing device 10 as a part of the storage device 180.

The first compressed layer weight data L1_WD may further include 1a-th length information LI1*a*, 1b-th length information LI1*b*, 1c-th length information LI1*c*, and 1d-th length information LI1*d* respectively indicating lengths of the 1a-th compressed weight data WD1*a*, the 1b-th compressed weight data WD1*b*, the 1c-th compressed weight data WD1*c*, and the 1d-th compressed weight data WD1*d*. The 1a-th length information LI1*a*, the 1b-th length information LI1*b*, the 1c-th length information LI1*c*, and the 1d-th length information LI1*d* may include information about start addresses on the storage device 180, from which the 1a-th compressed weight data WD1*a*, the 1b-th compressed weight data WD1*b*, the 1c-th compressed weight data WD1*c*, and the 1d-th compressed weight data WD1*d* are stored, and information of lengths (or sizes) of the addresses of the 1a-th compressed weight data WD1*a*, the 1b-th compressed weight data WD1*b*, the 1c-th compressed weight data WD1*c*, and the 1d-th compressed weight data WD1*d*.

The second compressed layer weight data L2_WD may further include 2a-th length information LI2*a*, 2b-th length information LI2*b*, 2c-th length information LI2*c*, and 2d-th length information LI2*d* respectively indicating lengths of the 2a-th compressed weight data WD2*a*, the 2b-th compressed weight data WD2*b*, the 2c-th compressed weight data WD2*c*, and the 2d-th compressed weight data WD2*d*. The 2a-th length information LI2*a*, the 2b-th length information LI2*b*, the 2c-th length information LI2*c*, and the 2d-th length information LI2*d* may include information about start addresses on the storage device 180, from which the 2a-th compressed weight data WD2*a*, the 2b-th compressed weight data WD2*b*, the 2c-th compressed weight data WD2*c*, and the 2d-th compressed weight data WD2*d* are stored, and information of lengths (or sizes) of the addresses of the 2a-th compressed weight data WD2*a*, the 2b-th compressed weight data WD2*b*, the 2c-th compressed weight data WD2*c*, and the 2d-th compressed weight data WD2*d*.

The third compressed layer weight data L3_WD may further include 3a-th length information LI3*a*, 3b-th length information LI3*b*, 3c-th length information LI3*c*, and 3d-th length information LI3*d* respectively indicating lengths of the 3a-th compressed weight data WD3*a*, the 3b-th compressed weight data WD3*b*, the 3c-th compressed weight data WD3*c*, and the 3d-th compressed weight data WD3*d*. The 3a-th length information LI3*a*, the 3b-th length information LI3*b*, the 3c-th length information LI3*c*, and the 3d-th length information LI3*d* may include information about start addresses on the storage device 180, from which the 3a-th compressed weight data WD3*a*, the 3b-th compressed weight data WD3*b*, the 3c-th compressed weight data WD3*c*, and the 3d-th compressed weight data WD3*d* are stored, and information of lengths (or sizes) of the addresses of the 3a-th compressed weight data WD3*a*, the 3b-th compressed weight data WD3*b*, the 3c-th compressed weight data WD3*c*, and the 3d-th compressed weight data WD3*d*.

Figure 3:
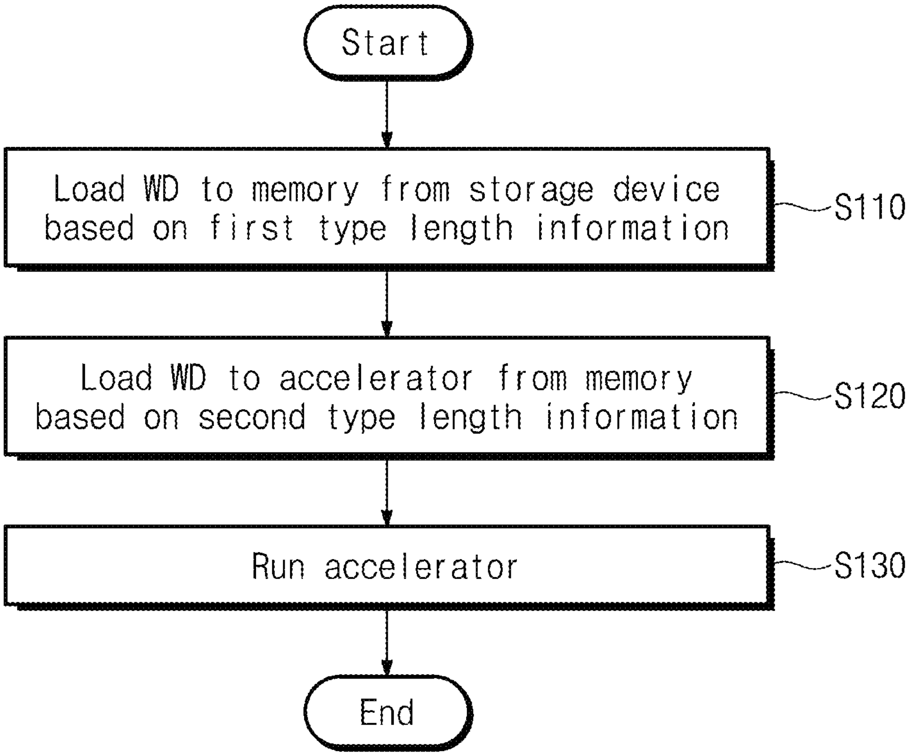
FIG. 3 illustrates an example of a method in which a computing device loads compressed weight data to an accelerator.

FIG. 3 illustrates an example of a method in which the computing device 10 loads compressed weight data to the accelerator 130. Referring to FIGS. 1, 2, and 3, in operation S110, the computing device 10 loads compressed weight data WD from the storage device 180 to the memory 160 based on first type length information. The weight data WD may include the 1a-th compressed weight data WD1*a*, the 1b-th compressed weight data WD1*b*, the 1c-th compressed weight data WD1*c*, and the 1d-th compressed weight data WD1*d* of the first compressed layer weight data L1_WD, the 2a-th compressed weight data WD2*a*, the 2b-th compressed weight data WD2*b*, the 2c-th compressed weight data WD2*c*, and the 2d-th compressed weight data WD2*d* of the second compressed layer weight data L2_WD, and the 3a-th compressed weight data WD3*a*, the 3b-th compressed weight data WD3*b*, the 3c-th compressed weight data WD3*c*, and the 3d-th compressed weight data WD3*d* of the third compressed layer weight data L3_WD.

The first type length information may include the 1a-th length information LI1*a*, the 1b-th length information LI1*b*, the 1c-th length information LI1*c*, and the 1d-th length information LI1*d* of the first compressed layer weight data L1_WD, the 2a-th length information LI2*a*, the 2b-th length information LI2*b*, the 2c-th length information LI2*c*, and the 2d-th length information LI2*d* of the second compressed layer weight data L2_WD, and the 3a-th length information LI3*a*, the 3b-th length information LI3*b*, the 3c-th length information LI3*c*, and the 3d-th length information LI3*d* of the third compressed layer weight data L3_WD.

The processor 120 may read the compressed weight data WD from the storage device 180 so as to be loaded to the memory 160 and/or may program the DMAC 170 to read the compressed weight data WD from the storage device 180 and to load the compressed weight data WD to the memory 160.

In operation S120, the computing device 10 loads the compressed weight data WD from the memory 160 to the accelerator 130 based on second type length information. For example, the second type length information may be a portion of the first type length information. As the compressed weight data WD are loaded to the accelerator 130 (using the second type length information), the computing device 10 may improve a speed at which the compressed weight data WD are loaded to the accelerator 130 and may reduce a loading time.

In at least one embodiment, the processor 120 may program the DMAC 170 to read the compressed weight data WD stored in the memory 160 and to load the compressed weight data WD to the accelerator 130. The accelerator 130 may receive the compressed weight data WD and may generate weight data by decompressing the compressed weight data WD (or releasing the compression of the compressed weight data WD). The accelerator 130 may load the weight data to the accelerator cores "C".

In operation S130, the computing device 10 runs the accelerator 130. For example, the processor 120 may control the accelerator 130 such that the accelerator 130 performs machine learning operations (e.g., such as learning, inference, or classification). The accelerator cores "C" of the accelerator 130 may perform the machine learning operations based on machine learning, based on data transferred from the processor 120 and the weight data loaded the accelerator cores "C".

Figure 4:
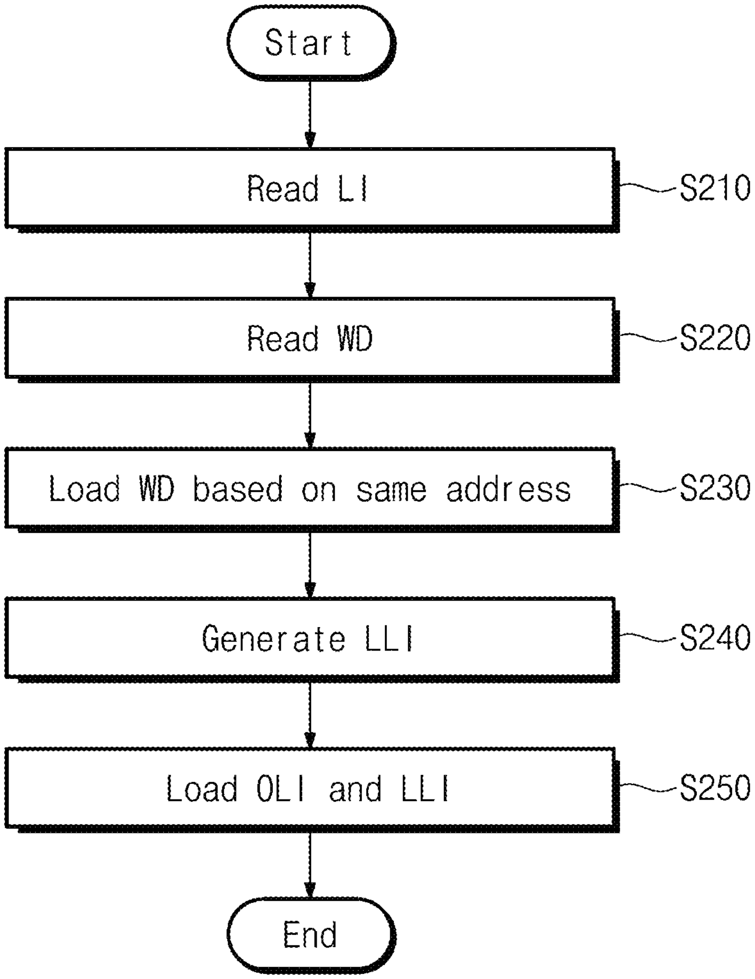
FIG. 4 illustrates an example of a method in which a computing device loads compressed weight data from a storage device to a memory.
Figure 5:
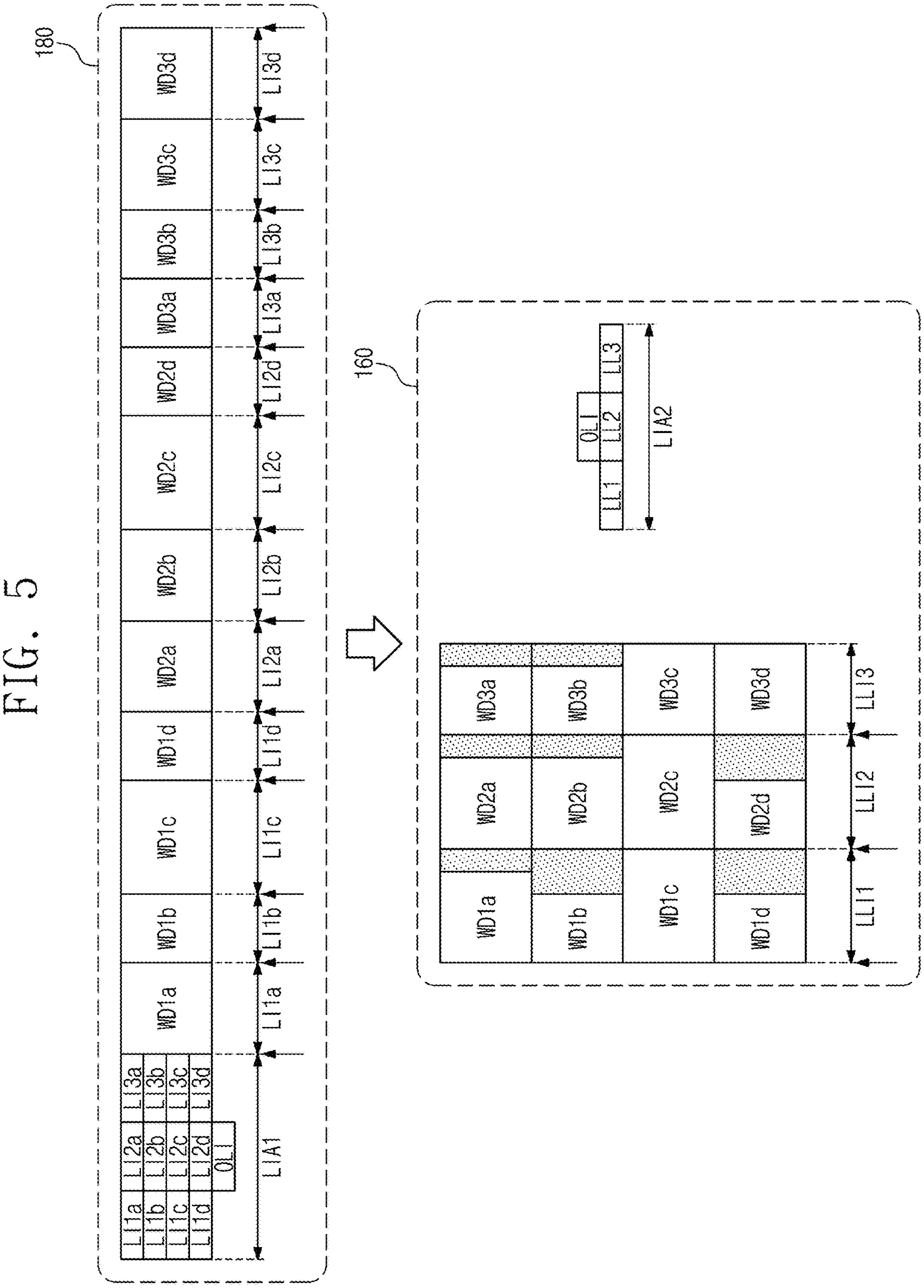
FIG. 5 illustrates an example of a process of loading compressed weight data from a storage device to a memory depending on the method of FIG. 4.

FIG. 4 illustrates an example of a method in which the computing device 10 loads compressed weight data WD from the storage device 180 to the memory 160 (e.g., an example of operation S110 of FIG. 3). FIG. 5 illustrates an example of a process of loading the compressed weight data WD from the storage device 180 to the memory 160 depending on the method of FIG. 4.

Referring to FIGS. 1, 4, and 5, in operation S210, the computing device 10 may read length information LI. For example, the processor 120 may read the 1a-th length information LI1*a*, the 1b-th length information LI1*b*, the 1c-th length information LI1*c*, the 1d-th length information LI1*d*, the 2a-th length information LI2*a*, the 2b-th length information LI2*b*, the 2c-th length information LI2*c*, the 2d-th length information LI2*d*, the 3a-th length information LI3*a*, the 3b-th length information LI3*b*, the 3c-th length information LI3*c*, the 3d-th length information LI3*d*, and original length information OLI from a first length information area LIA1 of the storage device 180. The original length information OLI may indicate the length (or size) of each weight data before compression.

In operation S220, the computing device 10 may read the compressed weight data WD. Each of the 1a-th length information LI1*a*, the 1b-th length information LI1*b*, the 1c-th length information LI1*c*, the 1d-th length information LI1*d*, the 2a-th length information LI2*a*, the 2b-th length information LI2*b*, the 2c-th length information LI2*c*, the 2d-th length information LI2*d*, the 3a-th length information LI3*a*, the 3b-th length information LI3*b*, the 3c-th length information LI3*c*, and the 3d-th length information LI3*d* may include information about a start address (referenced with an up arrow) of the storage device 180, from which relevant compressed weight data are stored, and a length (references with a side-to-side arrow) of the relevant compressed weight data.

The processor 120 or the DMAC 170 may read the compressed weight data WD from the storage device 180 by using the length information LI.

In operation S230, the computing device 10 may load the compressed weight data WD to the memory 160 based on the same address. For example, the processor 120 and/or the DMAC 170 may load the 1a-th compressed weight data WD1*a*, the 1b-th compressed weight data WD1*b*, the 1c-th compressed weight data WD1*c*, and the 1d-th compressed weight data WD1*d* of the first compressed layer weight data L1_WD onto storage spaces of the memory 160, which start from the same first start address and have sequential addresses, in parallel.

As illustrated in FIG. 5, 1a-th compressed weight data WD1*a*, the 1b-th compressed weight data WD1*b*, the 1c-th compressed weight data WD1*c*, and the 1d-th compressed weight data WD1*d* of the first compressed layer weight data L1_WD may have different lengths (or sizes). For example, in the example, the first compressed layer weight data L1_WD, the 1a-th compressed weight data WD1*a*, the 1b-th compressed weight data WD1*b*, and the 1d-th compressed weight data WD1*d* may be smaller in length (or size) than the 1c-th compressed weight data WD1*c*.

The processor 120 and/or the DMAC 170 may load the 2a-th compressed weight data WD2*a*, the 2b-th compressed weight data WD2*b*, the 2c-th compressed weight data WD2*c*, and the 2d-th compressed weight data WD2*d* of the second compressed layer weight data L2_WD onto storage spaces of the memory 160, which start from the same second start address and have sequential addresses, in parallel.

For example, the second start address may be an address immediately following the end address of the 1c-th compressed weight data WD1*c* having the largest length (or size) from among the 1a-th compressed weight data WD1*a*, the 1b-th compressed weight data WD1*b*, the 1c-th compressed weight data WD1*c*, and the 1d-th compressed weight data WD1*d* of the first compressed layer weight data L1_WD. In other words, the location of the second start address in the storage spaces of the memory 160 may be based on the length (or size) of the largest length (or size) from among the 1a-th compressed weight data WD1*a*, the 1b-th compressed weight data WD1*b*, the 1c-th compressed weight data WD1*c*, and the 1d-th compressed weight data WD1*d* of the first compressed layer weight data L1_WD.

As such, the end address of the 1a-th compressed weight data WD1*a* may be smaller than the end address of the 1c-th compressed weight data WD1*c*. The processor 120 or the DMAC 170 may write dummy data, a random pattern, a given pattern in the storage space of the memory 160, which ranges from an address immediately following the end address of the 1a-th compressed weight data WD1*a* to the end address of the 1c-th compressed weight data WD1*c*, or may not write data therein. The storage space where data are not written may have a fixed value, for example, a value of "0" or "1".

As illustrated in FIG. 5, the 2a-th compressed weight data WD2*a*, the 2b-th compressed weight data WD2*b*, the 2c-th compressed weight data WD2*c*, and the 2d-th compressed weight data WD2*d* of the second compressed layer weight data L2_WD may have different lengths (or sizes). For example, in the example, the second compressed layer weight data L2_WD, the 2a-th compressed weight data WD2*a*, the 2b-th compressed weight data WD2*b*, and the 2d-th compressed weight data WD2*d* may be smaller in length (or size) than the 2c-th compressed weight data WD2*c*.

The processor 120 and/or the DMAC 170 may load the 3a-th compressed weight data WD3*a*, the 3b-th compressed weight data WD3*b*, the 3c-th compressed weight data WD3*c*, and the 3d-th compressed weight data WD3*d* of the third compressed layer weight data L3_WD onto storage spaces of the memory 160, which start from the same third start address and have sequential addresses, in parallel.

For example, the third start address may be an address immediately following the end address of the 2c-th compressed weight data WD2*c* having the largest length (or size) from among the 2a-th compressed weight data WD2*a*, the 2b-th compressed weight data WD2*b*, the 2c-th compressed weight data WD2*c*, and the 2d-th compressed weight data WD2*d* of the second compressed layer weight data L2_WD. In other words, the location of the third start address in the storage spaces of the memory 160 may be based on the length (or size) of the largest length (or size) from among the 2a-th compressed weight data WD2*a*, the 2b-th compressed weight data WD2*b*, the 2c-th compressed weight data WD2*c*, and the 2d-th compressed weight data WD2*d* of the second compressed layer weight data L2_WD.

As such, the end address of the 2a-th compressed weight data WD2*a* may be smaller than the end address of the 2c-th compressed weight data WD2*c*. The processor 120 or the DMAC 170 may write dummy data, a random pattern, a given pattern in the storage space of the memory 160, which ranges from an address immediately following the end address of the 2a-th compressed weight data WD2*a* to the end address of the 2c-th compressed weight data WD2*c*, or may not write data therein. The storage space where data are not written may have a fixed value, for example, a value of "0" or "1".

As illustrated in FIG. 5, the 3a-th compressed weight data WD3*a*, the 3b-th compressed weight data WD3*b*, the 3c-th compressed weight data WD3*c*, and the 3d-th compressed weight data WD3*d* may have different lengths (or sizes). For example, in the example, the third compressed layer weight data L3_WD, the 3a-th compressed weight data WD3*a*, the 3b-th compressed weight data WD3*b*, and the 3d-th compressed weight data WD3*d* may be smaller in length (or size) than the 3c-th compressed weight data WD3*c*.

The end address of the 3a-th compressed weight data WD3*a* may be smaller than the end address of the 3c-th compressed weight data WD3*c*. The processor 120 and/or the DMAC 170 may write dummy data, a random pattern, a given pattern in the storage space of the memory 160, which ranges from an address immediately following the end address of the 3a-th compressed weight data WD3*a* to the end address of the 3c-th compressed weight data WD3*c*, or may not write data therein. The storage space where data are not written may have a fixed value, for example, a value of "0" or "1".

In operation S240, the computing device 10 may generate layer length information LLI. The layer length information LLI may include first layer length information LLI1 including information about a start address (referenced with an up arrow) of the memory 160, from which the first compressed layer weight data L1_WD are stored, or information about a length (referenced with a side-to-side arrow) of the first compressed layer weight data L1_WD.

The layer length information LLI may include second layer length information LLI2 including information about a start address (referenced with an up arrow) of the memory 160, from which the second compressed layer weight data L2_WD are stored, or information about a length (referenced with a side-to-side arrow) of the second compressed layer weight data L2_WD.

The layer length information LLI may further include third layer length information LLI3 including information about a start address (referenced with an up arrow) of the memory 160, from which the third compressed layer weight data L3_WD are stored, or information about a length (referenced with a side-to-side arrow) of the third compressed layer weight data L3_WD.

In operation S250, the computing device 10 may load the original length information OLI and the layer length information LLI to the memory 160. For example, the processor 120 and/or the DMAC 170 may store the original length information OLI and the layer length information LLI in a second length information area LIA2 of the memory 160.

Figure 6:
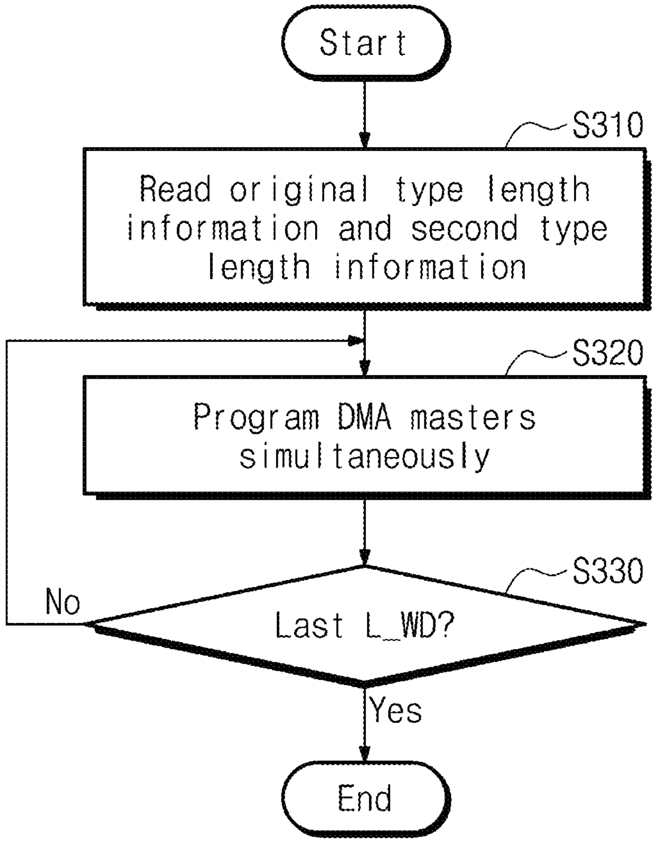
FIG. 6 illustrates an example of a method in which a computing device loads compressed weight data to an accelerator.

FIG. 6 illustrates an example of a method in which the computing device 10 loads the compressed weight data WD to the accelerator 130 (e.g., an example of operation S120 of FIG. 2). Referring to FIGS. 1, 5, and 6, in operation S310, the computing device 10 may read first type length information and second type length information from the memory 160. For example, the first type length information may be the original length information OLI including length information of each weight data. The second type length information may be the layer length information LLI including information of each layer. The processor 120 and/or the DMAC 170 may read the first type length information from the memory 160 and may transmit the first type length information to the data controllers CT of the accelerator 130.

In operation S320, the computing device 10 may simultaneously program the DMA masters "M". For example, the processor 120 may program the DMA masters "M" by using the second type length information.

The processor 120 may program the direct memory access (DMA) masters "M" to read data from the memory 160 by using the first layer length information LLI1 (see FIG. 5) and to transfer the read data to the accelerator 130. The DMA masters "M" may read data of a storage space, which starts from a first start address indicated by the first layer length information LLI1 and has a length (or size) indicated by the first layer length information LLI1, in parallel or simultaneously and may transfer the data to the data controllers CT of the accelerator 130, respectively. The data controllers CT may convert the data transferred from the memory 160 into the 1a-th compressed weight data WD1*a*, the 1b-th compressed weight data WD1*b*, the 1c-th compressed weight data WD1*c*, and the 1d-th compressed weight data WD1*d*, based on the original length information OLI.

In operation S330, the processor 120 may determine whether the data transferred to the accelerator 130 are the last compressed layer weight data L_WD. For example, the processor 120 may determine whether the data transferred to the accelerator 130 are data including the third compressed layer weight data L3_WD. When the data transferred to the accelerator 130 correspond to the last compressed layer weight data L_WD, the processor 120 may terminate the loading of the compressed weight data WD to the accelerator 130.

When the data transferred to the accelerator 130 do not correspond to the last compressed layer weight data L_WD, the processor 120 may load the compressed layer weight data of a next layer to the accelerator 130. For example, the processor 120 may load the second compressed layer weight data L2_WD to the accelerator 130 by programming the DMA masters "M" by using the second layer length information LLI2. Also, the processor 120 may load the third compressed layer weight data L3_WD to the accelerator 130 by programming the DMA masters "M" by using the third layer length information LLI3.

As described above, the computing device 10 according to at least one embodiment of the present disclosure may load the compressed weight data WD to the accelerator 130 by using the plurality of DMA masters "M". Accordingly, a speed at which the compressed weight data WD are loaded to the accelerator 130 may be improved, and a loading time may be shortened.

Also, the computing device 10 according to at least embodiment of the present disclosure may load weight data of all the layers to the accelerator 130 by using the length information of weight data, whose length is the largest, from among the weight data of the layers, which have different lengths (sizes). Accordingly, because the number of times that the DMA masters "M" are programmed decreases, a speed at which the compressed weight data WD are loaded to the accelerator 130 may be improved, and a loading time may be shortened.

Figure 7:
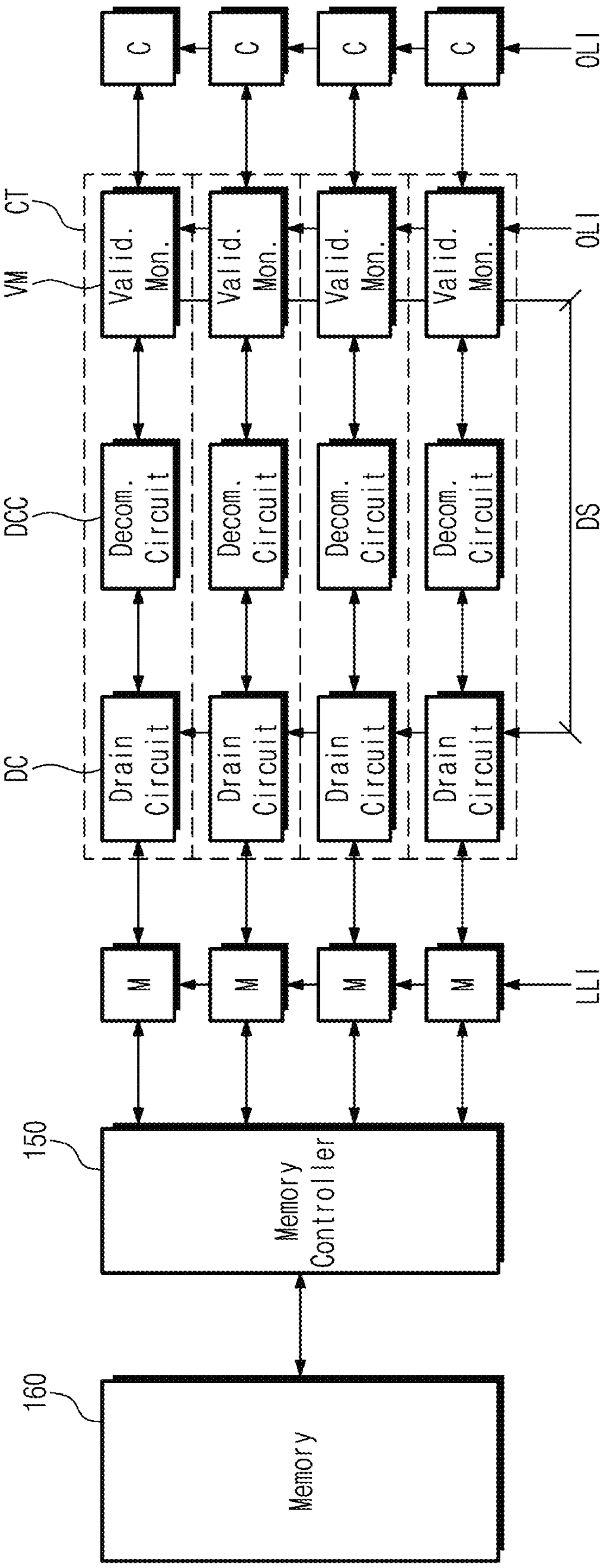
FIG. 7 illustrates data controllers and relevant components, according to at least one embodiment of the present disclosure.

FIG. 7 illustrates the data controllers CT and relevant components, according to at least one embodiment of the present disclosure. Referring to FIGS. 1, 5, 6, and 7, the DMA masters "M" may request the memory controller 150 to read the compressed weight data WD stored in the memory 160. The DMA masters "M" may receive data from the memory 160 through the memory controller 150 by the given access unit and may transfer the received data to the data controllers CT. For example, the DMA masters "M" may be programmed to read data whose length (or size) corresponds to the layer length information LLI. For example, the DMA masters "M" may be programmed by using the same layer length information LLI.

Each of the data controllers CT may include a drain circuit DC, a decompression circuit DCC, and a validity monitor VM (or a validity monitor circuit). One DMA master "M" may be connected to one accelerator core "C" through one drain circuit DC, one decompression circuit DCC, and one validity monitor VM of one data controller CT. In an embodiment, one DMA master "M", one drain circuit DC, one decompression circuit DCC, and one validity monitor VM may constitute a data chain which converts data read from the memory 160, that is, data including compressed weight data into weight data so as to be transferred to one accelerator core "C", Each of the drain circuits DC may receive data from the corresponding DMA master "M" among the DMA masters "M". Each of the drain circuits DC may receive a drain signal DS from the corresponding validity monitor VM among the validity monitors VM. When the drain circuit DC is in an inactive state, each of the drain circuits DC may be configured to transfer data provided from the corresponding DMA master "M" to the corresponding decompression circuit DCC among the decompression circuits DCC. When the drain circuit DC is in an active state, each of the drain circuits DC may be configured to drain the data provided from the corresponding DMA master "M" without transferring the data to the corresponding decompression circuits DCC. For example, when the drain circuit DC is in the active state, each of the drain circuits DC may discard or ignore the data provided from the corresponding DMA master "M".

Each of the decompression circuits DCC may be configured to perform decompression for the data transferred from the corresponding drain circuit DC. Each of the decompression circuits DCC may transfer the decompressed data, that is, the weight data to the corresponding validity monitor VM.

Each of the validity monitors VM may receive the weight data (e.g., the decompressed weight data) from the corresponding decompression circuit DCC. The validity monitors VM may receive the original length information OLI in common. Each of the validity monitors VM may monitor whether the length (or size) of the data (e.g., decompressed weight data) received from the corresponding decompression circuit DCC reaches a length (or size) indicated by the original length information OLI.

When the length (or size) of the data received from the corresponding decompression circuit DCC does not reach the length (or size) indicated by the original length information OLI, each of the validity monitors VM may deactivate the drain signal DS and may transfer the data provided from the decompression circuit DCC to the corresponding accelerator core among the accelerator cores "C". When the length (or size) of the data received from the corresponding decompression circuit DCC reaches the length (or size) indicated by the original length information OLI, each of the validity monitors VM may activate the drain signal DS.

Figure 8:
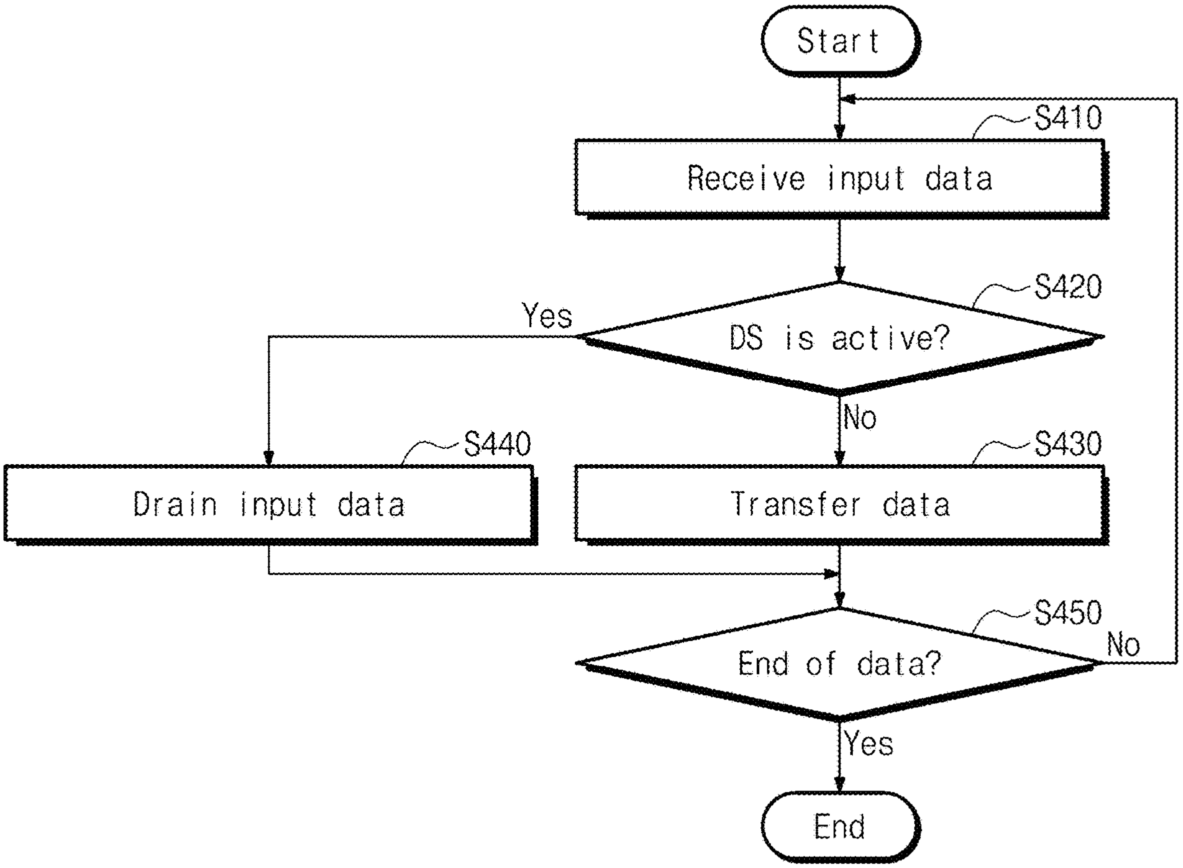
FIG. 8 illustrates an example of an operating method of a drain circuit.

FIG. 8 illustrates an example of an operating method of the drain circuit DC. Referring to FIGS. 1, 7, and 8, in operation S410, the drain circuit DC may receive input data. For example, the drain circuit DC may receive data including compressed weight data from the corresponding DMA master "M".

In operation S420, the drain circuit DC may determine whether the drain signal DS is in the active state. When the drain signal DS is not in the active state, in operation S430, the drain circuit DC may transfer the data. For example, the drain circuit DC may transfer the input data received from the corresponding DMA master "M" to the corresponding decompression circuit DCC. Afterwards, operation S450 may be performed.

When the drain signal DS is in the active state, in operation S440, the drain circuit DC may drain the input data. For example, the drain circuit DC may ignore or discard the input data. Afterwards operation S450 may be performed.

In operation S450, the drain circuit DC may determine whether the data ended. For example, when the input data are not received from the corresponding DMA master "M" any longer, the drain circuit DC may determine that the data has ended. When it is determined that the data ended, the drain circuit DC may terminate the process. When it is determined that the data has not end, the drain circuit DC may again perform operation S410.

As described above, the computing device 10 according to at least one embodiment of the present disclosure may store compressed weight data with different sizes in the storage space of the memory 160, which has the same start address and the same layer length information. The computing device 10 may simultaneously program the DMA masters "M" to transfer weight data to the accelerator 130 in parallel by using the same start address and the same layer length information. The drain circuits DC and the validity monitors VM of the data controllers CT of the accelerator 130 may extract decompressed weight data so as to be transferred to the accelerator cores "C". Because the number of times that the DMA masters "M" are programmed decreases, a speed at which the computing device 10 loads compressed weight data to the accelerator 130 may be improved, and a loading time may decrease.

Figure 9:
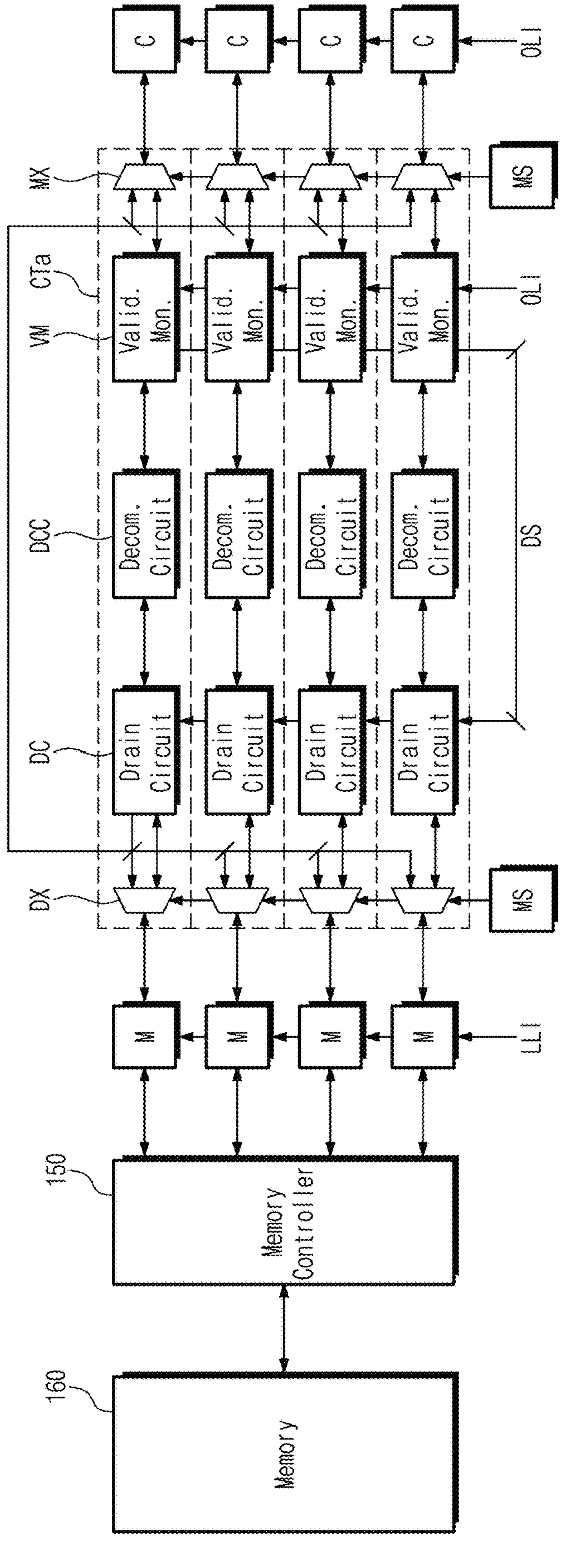
FIG. 9 illustrates data controllers and relevant components, according to at least one embodiment of the present disclosure.

FIG. 9 illustrates data controllers CTa and relevant components, according to another embodiment of the present disclosure. Compared to the data controllers CT of FIG. 8, the data controllers CTa of FIG. 9 may further include demultiplixers DX and multiplexers MX.

The demultiplixers DX may be provided between the DMA masters "M" and the drain circuits DC. The multiplexers MX may be provided between the validity monitors VM and the accelerator cores "C". The demultiplixers DX and the multiplexers MX may operate in response to a mode signal MS.

In at least one embodiment, the computing device 10 may provide a compression mode and a non-compression mode. In the compression mode, compressed weight data may be provided to the storage device 180. The computing device 10 may load compressed weight data to the accelerator 130 depending on the method described with reference to FIGS. 1 to 8. In the compression mode, the mode signal MS may have a first value. In response to the mode signal MS having the first value, the demultiplixers DX may transfer the data provided from the DMA masters "M" to the drain circuits DC. In response to the mode signal MS having the first value, the multiplexers MX may transfer the data provided from the validity monitors VM to the accelerator cores "C".

In the non-compression mode, uncompressed weight data may be provided to the storage device 180. The uncompressed weight data may have the same sizes and may be loaded to the memory 160. The computing device 10 may program the DMA masters "M" by using the same start address and the same layer length information. The DMA masters "M" may transfer the uncompressed weight data stored in the memory 160 to the accelerator 130.

In the non-compression mode, the mode signal MS may have a second value different from the first value. In response to the mode signal MS having the second value, the demultiplixers DX may transfer the data provided from the DMA masters "M" to the multiplexers MX. In response to the mode signal MS having the second value, the multiplexers MX may transfer the data provided from the demultiplixers DX to the accelerator cores "C".

Figure 10:
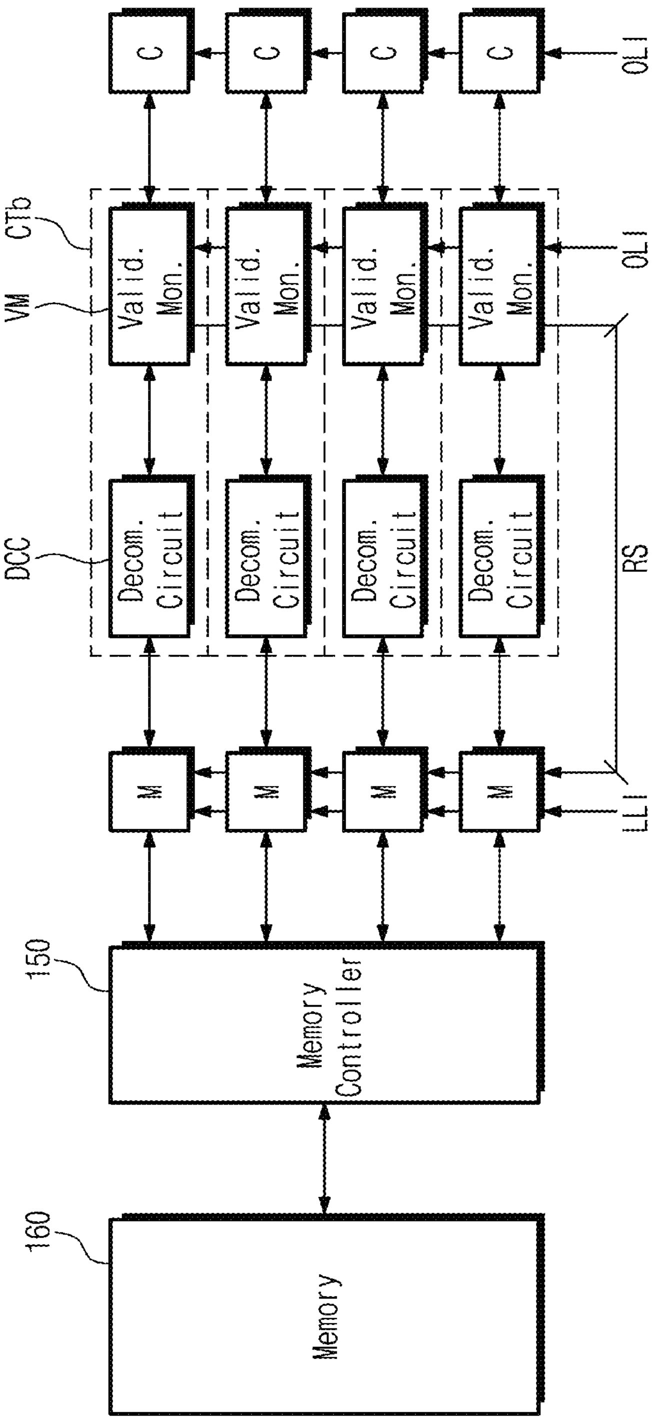
FIG. 10 illustrates data controllers and relevant components, according to at least one embodiment of the present disclosure.

FIG. 10 illustrates data controllers CTb and relevant components, according to at least one embodiment of the present disclosure. Referring to FIG. 10, each of the data controllers CTb may include the decompression circuit DCC and the validity monitor VM.

Each of the decompression circuits DCC may decompress data transferred from the corresponding DMA master among the DMA masters "M", that is, data including compressed weight data. Each of the decompression circuits DCC may transfer the decompressed data to the corresponding validity monitor VM among the validity monitors VM.

Each of the validity monitors VM may monitor whether the length (or size) of the data transferred from the corresponding decompression circuit DCC reaches the length (or size) indicated by the original length information OLI. When the length (or size) of the data transferred from the decompression circuit DCC does not reach the length (or size) indicated by the original length information OLI, each of the validity monitor VM may deactivate a reset signal RS. Each of the validity monitors VM may transfer the data provided from the decompression circuit DCC to the corresponding accelerator core "C" among the accelerator cores "C".

When the length (or size) of the data transferred from the decompression circuit DCC reaches the length (or size) indicated by the original length information OLI, each of the validity monitor VM may activate the reset signal RS. The reset signal RS may be transferred to the corresponding DMA master "M" among the DMA masters "M". The corresponding DMA master "M" may be reset in response to a determination that the reset signal RS is activated.

In at least one embodiment, the reset signals RS may also be provided to the decompression circuits DCC. The corresponding decompression circuit DCC may be reset in response to a determination that the reset signal RS is activated.

In at least one embodiment, as described with reference to FIG. 9, the data controllers CTb may include the demultiplixers DX and the multiplexers MX. In the non-compression mode, the demultiplixers DX and the multiplexers MX may bypass the data transferred from the DMA masters "M" to the accelerator cores "C".

Figure 11:
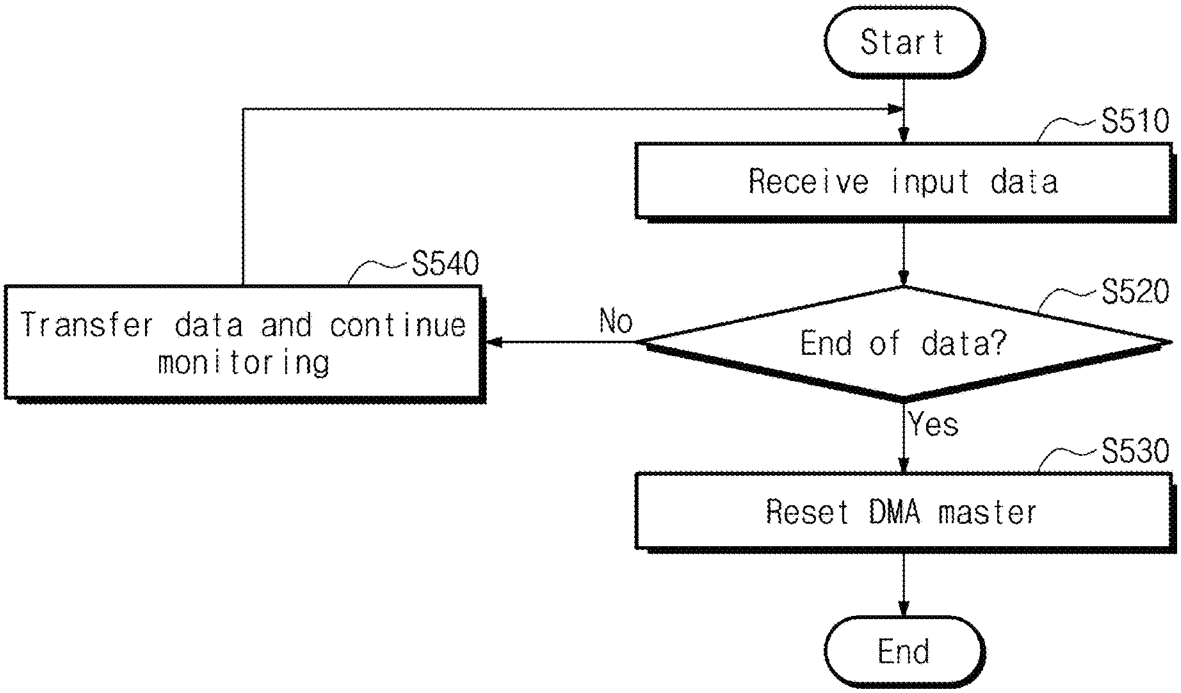
FIG. 11 illustrates an example of an operating method of a validity monitor of each of data controllers of FIG. 10.

FIG. 11 illustrates an example of an operating method of the validity monitor VM of each of the data controllers CTb of FIG. 10. Referring to FIGS. 1, 10, and 11, in operation S510, the validity monitor VM may receive input data. For example, the validity monitor VM may receive weight data from the corresponding decompression circuit DCC.

In operation S520, the validity monitor VM may determine whether the data has ended (or whether a data end has been reached). For example, when the length (or size) of the received weight data reaches the length (or size) indicated by the original length information OLI, the validity monitor VM may determine that the data has ended. When it is determined that the data has ended, in operation S530, the validity monitor VM may reset the corresponding DMA master "M" among the DMA masters "M". Afterwards, the validity monitor VM may terminate the process.

In operation S540, the validity monitor VM may transfer the input data to the corresponding accelerator core "C" among the accelerator cores "C" and may continue monitoring. Afterwards, the validity monitor VM may again start from operation S410.

As described above, the computing device 10 according to at least one embodiment of the present disclosure may store compressed weight data with different sizes in the storage space of the memory 160, which has the same start address and the same layer length information. The computing device 10 may simultaneously program the DMA masters "M" to transfer weight data to the accelerator 130 in parallel by using the same start address and the same layer length information. The validity monitors VM of the data controllers CTb of the accelerator 130 may extract decompressed weight data so as to be transferred to the accelerator cores "C". Because the number of times that the DMA masters "M" are programmed decreases, a speed at which the computing device 10 loads compressed weight data to the accelerator 130 may be improved, and a loading time may decrease.

Figure 12:
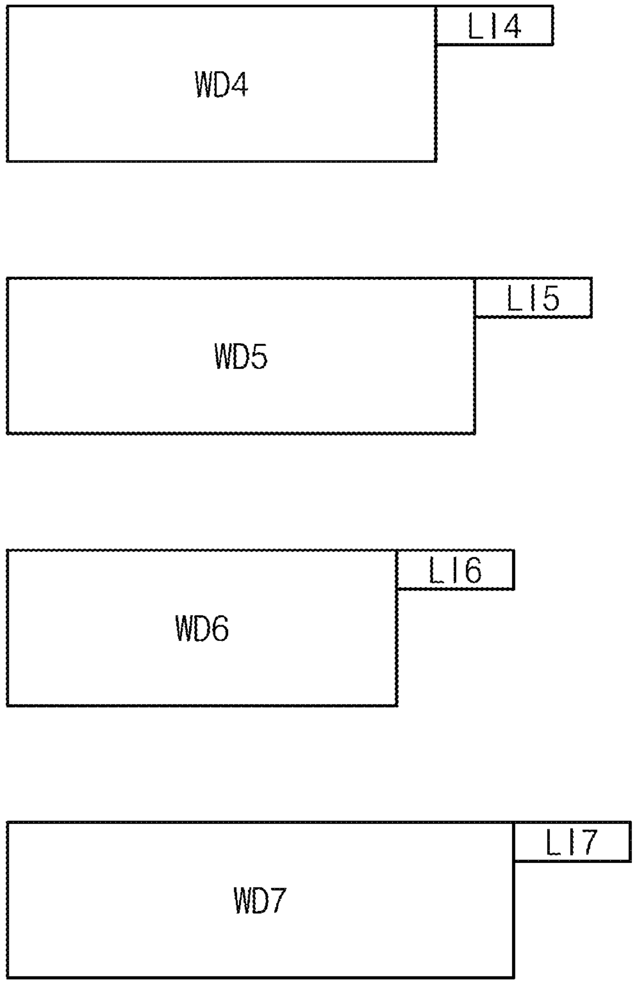
FIG. 12 illustrates another example of a compressed form of weight data loaded to an accelerator.

FIG. 12 illustrates another example of a compressed form of weight data (e.g., compressed weight data) loaded to the accelerator 130. Referring to FIGS. 1 and 12, in at least one embodiment, the accelerator 130 may run the machine learning module including four layers.

Each of fourth compressed weight data WD4, fifth compressed weight data WD5, sixth compressed weight data WD6, and seventh compressed weight data WD7 may correspond to one layer of the machine learning module. Fourth length information LI4 indicating the length of the fourth compressed weight data WD4, fifth length information LI5 indicating the length of the fifth compressed weight data WD5, sixth length information LI6 indicating the length of the sixth compressed weight data WD6, and seventh length information LI7 indicating the length of the seventh compressed weight data WD7 may be stored in the storage device 180 together with the fourth compressed weight data WD4, the fifth compressed weight data WD5, the sixth compressed weight data WD6, and the seventh compressed weight data WD7.

Figure 13:
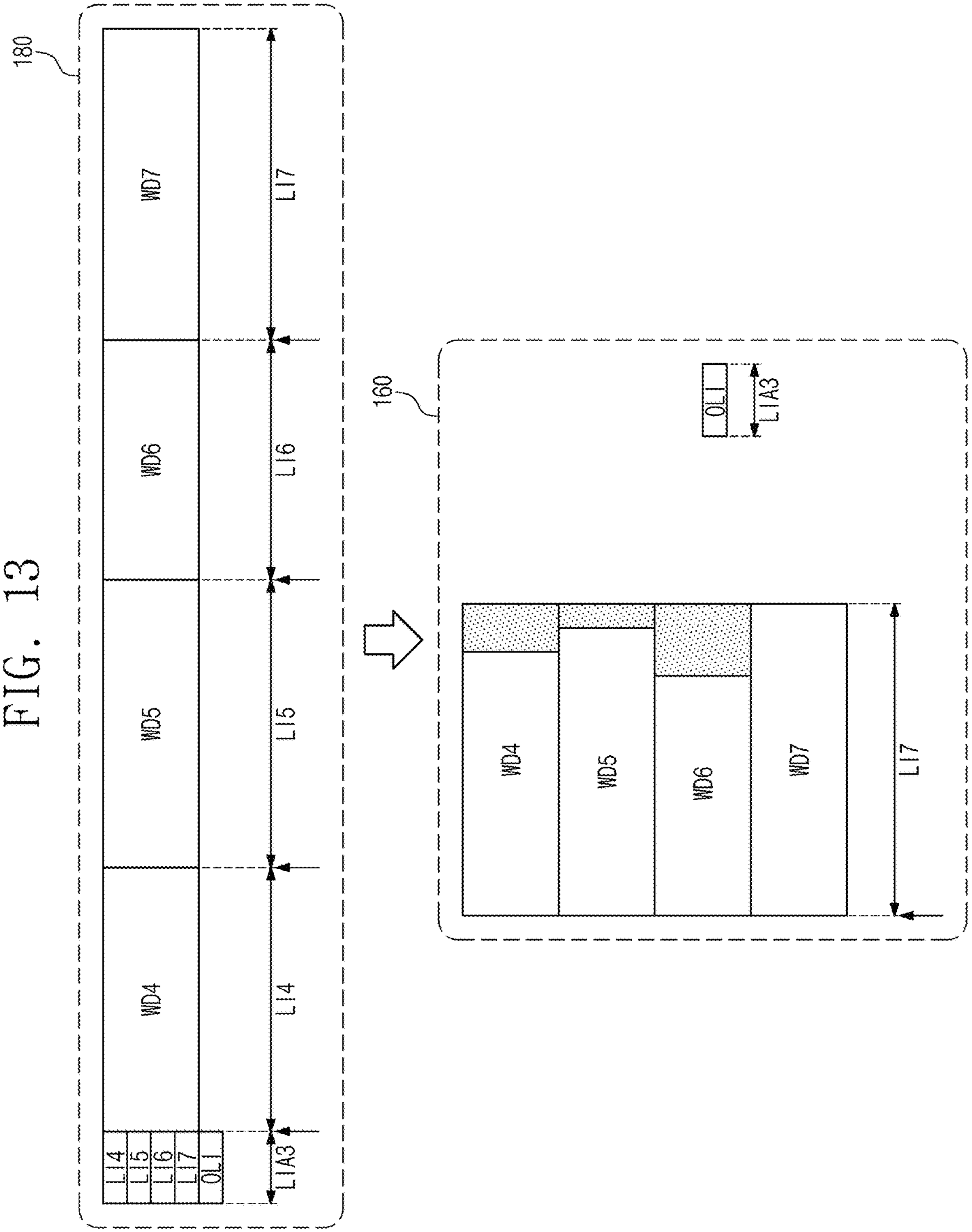
FIG. 13 illustrates an example of a process of loading compressed weight data from a storage device to a memory depending on the method of FIG. 4.

FIG. 13 illustrates an example of a process of loading the compressed weight data WD from the storage device 180 to the memory 160 depending on the method of FIG. 4. Referring to FIGS. 1, 4, and 13, the fourth length information LI4, the fifth length information LI5, the sixth length information LI6, the seventh length information LI7, and the original length information OLI may be stored in a third length information area LIA3 of the storage device 180.

Each of the fourth compressed weight data WD4, the fifth compressed weight data WD5, the sixth compressed weight data WD6, and the seventh compressed weight data WD7 may be stored in a storage space whose addresses are sequential.

The fourth length information LI4 may include information about a start address (referenced by an up arrow) and a length (referenced by a side-to-side arrow) of the fourth compressed weight data WD4. The fifth length information LI5 may include information about a start address (referenced by an up arrow) and a length (referenced by a side-to-side arrow) of the fifth compressed weight data WD5.

The sixth length information LI6 may include information about a start address (referenced by an up arrow) and a length (referenced by a side-to-side arrow) of the sixth compressed weight data WD6. The seventh length information LI7 may include information about a start address (refer to an up arrow) and a length (refer to a right arrow) of the seventh compressed weight data WD7.

The processor 120 or the DMAC 170 may load each of the fourth compressed weight data WD4, the fifth compressed weight data WD5, the sixth compressed weight data WD6, and the seventh compressed weight data WD7 onto storage spaces of the memory 160, which start from the same start address and have sequential addresses, in parallel.

As illustrated in FIG. 13, the fourth compressed weight data WD4, the fifth compressed weight data WD5, and the sixth compressed weight data WD6 may be smaller in length (or size) than the seventh compressed weight data WD7.

The fourth compressed weight data WD4, the fifth compressed weight data WD5, the sixth compressed weight data WD6, and the seventh compressed weight data WD7 loaded to the memory 160 may be loaded to the accelerator 130 depending on the method described with reference to FIGS. 1 to 11.

Figure 14:
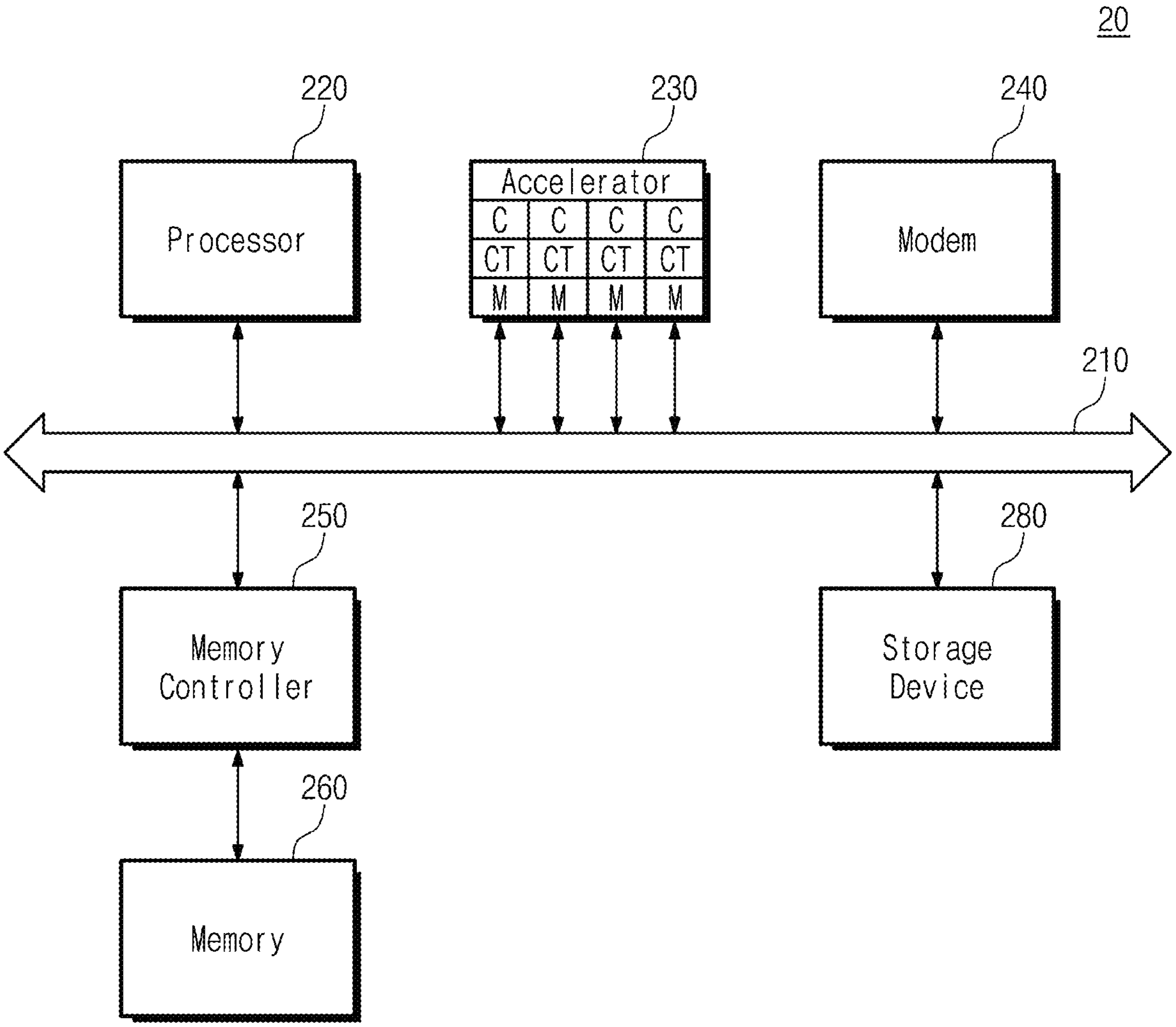
FIG. 14 illustrates a computing device according to another embodiment of the present disclosure.

FIG. 14 illustrates a computing device 20 according to another embodiment of the present disclosure. Referring to FIG. 14, the computing device 20 may include a system bus 210, a processor 220, an accelerator 230, a modem 240, a memory controller 250, a memory 260, and a storage device 280. The system bus 210, the processor 220, the modem 240, the memory controller 250, the memory 260, and/or the storage device 280 may have the same as and/or substantially similar to the system bus 110, the processor 120, the modem 140, the memory controller 150, the memory 160, the direct memory access controller (DMAC) 170, and/or the storage device 180. Therefore, repeat descriptions thereof may be omitted.

The accelerator 230 may include the accelerator cores "C", the data controllers CT, and the DMA masters "M". The DMA masters "M" may be dedicated for the accelerator 230. The loading of compressed weight data to the accelerator 230 may be the same as described with reference to FIGS. 1 to 13 except that the DMA masters "M" are included in the accelerator 230.

In at least one embodiment, the DMA masters "M" included in the accelerator 230 may be called AXI maters.

Some embodiments in which the computing device 10 or 20 includes one accelerator 130 or 230 is described. However, the examples are not limited thereto, and the computing device 10 or 20 may include two or more accelerators. The computing device 10 or 20 may load compressed weight data to at least one accelerator among the two or more accelerators by using the DMA masters "M" included in the at least one accelerator. Alternatively, the computing device 10 or 20 may load compressed weight data to at least one accelerator by using the DMA masters "M" of a separate DMA controller.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above embodiments, functional components according to embodiments of the present disclosure are referenced by using functional blocks and terms directed towards functional said functional blocks elements (e.g., including "processor," "accelerator," etc.). The blocks may be implemented with processing circuitry, such as various hardware devices (such as an integrated circuit, an application specific IC (ASIC), a field programmable gate array (FPGA), and a complex programmable logic device (CPLD)), firmware driven in hardware devices, software (such as an application), and/or a combination of a hardware device and/or software. In at least some embodiments the processing circuitry more specifically may be included in (and/or enabled by), but is not limited to, a central processing unit (CPU), an arithmetic logic unit (ALU), a digital signal processor, a microcomputer, a field programmable gate array (FPGA), a System-on-Chip, (SoC), a programmable logic unit, a microprocessor, application-specific integrated circuit (ASIC), etc. and/or may include active and/or passive electrical components such as transistors, resistors, capacitors, etc., and/or electronic circuits including one or more of said components. Also, the blocks may include circuits implemented with semiconductor elements in an integrated circuit, or circuits enrolled as an intellectual property (IP). For example, the circuits may include active and/or passive electrical components such as transistors, resistors, capacitors, etc.

According to embodiments of the present disclosure, direct memory access (DMA) masters which load compressed weight data to a machine learning accelerator may be simultaneously programmed by using the same start address and the same length information. Accordingly, a machine learning accelerator capable of reducing a time taken to load compressed weight data, a computing device including the machine learning accelerator, and a method of loading data to the machine learning accelerator are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A machine learning accelerator comprising:

a first data controller configured to store original length information indicating an original length for data, to receive first data with a first length, to generate second data having the original length by decompressing the first data with the first length, and to output the second data having the original length;

a second data controller configured to store the original length information, to receive third data with a second length shorter than the first length, to generate fourth data having the original length by decompressing the third data with the second length, and to output the fourth data having the original length;

a first accelerator core configured to receive the second data having the original length and to perform a first machine learning-based operation using the second data as first weight data; and a second accelerator core configured to receive the fourth data having the original length and to perform a second machine learning-based operation using the fourth data as second weight data, wherein each of the first data controller and the second data controller is configured to monitor a timing at which decompression is completed, based on the original length, and terminate the decompression at the timing at which the decompression is completed.

2. The machine learning accelerator of claim 1, wherein the machine learning accelerator is configured such that the first data controller and the second data controller receive the first data and the second data in parallel, and output the second data and the fourth data in parallel.

3. The machine learning accelerator of claim 1, wherein at least one of the first data controller and the second data controller includes:

a drain circuit configured to receive corresponding data among the first data and the second data and to output the corresponding data when a corresponding drain signal is in an inactive state;

a decompression circuit configured to receive the corresponding data from the drain circuit, to decompress the corresponding data, and to output the decompressed data; and a monitor circuit configured to activate the corresponding drain signal when decompression of data indicated by the original length information is completed, and wherein the drain circuit is configured to stop outputting the corresponding data in response to that the corresponding drain signal is in an active state.

4. The machine learning accelerator of claim 3, further comprising at least one of a first direct memory access (DMA) master configured to read the first data with the first length and to transfer the first data to the decompression circuit of the first data controller; and a second DMA master configured to read fifth data, the fifth data having the first length and including the second data, and to transfer the fifth data to the decompression circuit of the second data controller, wherein the first DMA master and the second DMA master are simultaneously programmed based on the same start address and the first length.

5. The machine learning accelerator of claim 3, wherein each of the at least one of the first data controller and the second data controller includes:

a decompression circuit configured to receive corresponding data among the first data and the second data, to decompress the corresponding data, and to output the decompressed data; and a monitor circuit configured to activate a reset signal when the decompression of the corresponding data, indicated by the original length information, is completed, and wherein the decompression circuit is configured to stop the decompression of the corresponding data in response to a determination that the reset signal is in an active state.

6. The machine learning accelerator of claim 5, wherein the monitor circuit is configured to transmit the reset signal to a corresponding direct memory access (DMA) master among an external first DMA master and an external second DMA master.

7. The machine learning accelerator of claim 5, further comprising:

a first direct memory access (DMA) master configured to read the first data with the first length and to transfer the first data to the decompression circuit of the first data controller; and a second DMA master configured to read fifth data, the fifth data having the first length and including the second data, and to transfer the fifth data to the decompression circuit of the second data controller, wherein the first DMA master is configured to stop reading the first data in response to a determination that the reset signal is activated by the monitor circuit of the first data controller, and wherein the second DMA master is configured to stop reading the fifth data in response to a determination that the reset signal is activated by the monitor circuit of the second data controller.

8. The machine learning accelerator of claim 7, wherein the first DMA master and the second DMA master are simultaneously programmed based on the same start address and the first length.

9. A computing device comprising:

a memory configured to store first data with a first length and second data with a second length shorter than the first length; and a machine learning accelerator configured to receive the first data and third data from the memory, the third data having the first length and including the second data, wherein the machine learning accelerator is configured to generate first weight data by decompressing the first data with the first length, convert the third data with the first length into the second data with the second length, generate second weight data by decompressing the second data with the second length, and perform a machine learning-based operation based on the first weight data and the second weight data.

10. The computing device of claim 9, further comprising:

a first direct memory access (DMA) master configured to read the first data and a second DMA master configured to read the third data with the first length; and a processor configured to program the first DMA master and the second DMA master to simultaneously read the first data with the first length and the third data with the first length from the memory.

11. The computing device of claim 10, wherein the processor is configured to simultaneously program the first DMA master and the second DMA master based on the first length and the same start address.

12. The computing device of claim 11, wherein the third data further includes dummy data, and wherein the second DMA master is configured to read the second data from the memory and to then read the dummy data from the memory.

13. The computing device of claim 12, wherein the machine learning accelerator is configured to ignore the dummy data after completing the decompression of the second data.

14. The computing device of claim 9, wherein the machine learning accelerator includes a first direct memory access (DMA) master configured to read the first data and a second DMA master configured to read the third data with the first length, and wherein the computing device further comprises:

a processor configured to program the first DMA master and the second DMA master to simultaneously read the first data with the first length and the third data with the first length from the memory.

15. The computing device of claim 9, further comprising:

a storage device storing the first data with the first length and the second data with the second length, wherein the computing device is configured to read the first data and the second data from the storage device and to store the read first and second data thus to the memory.

16. The computing device of claim 15, wherein the memory is configured to further store third data with a third length and fourth data with a fourth length, and wherein the computing device is configured to store the first data and the second data starting from the same first start address of the memory and to store the third data and the fourth data starting from the same second start address of the memory.

17. The computing device of claim 16, wherein a difference between the first start address and the second start address corresponds to the first length.

18. The computing device of claim 17, wherein the third data include the second data and dummy data between a remainder of an end address of the second data and the second start address.

19. A method in which a processor loads data to a machine learning accelerator, the method comprising:

simultaneously programming, at the processor, two or more direct memory access (DMA) masters using a first start address and first length information; and reading, at the two or more DMA masters, data from a memory in parallel based on the first start address and the first length information and transferring the data read in parallel to the machine learning accelerator, wherein the machine learning accelerator is configured to generate first weight data by decompressing first data corresponding to the first length information from among the data read in parallel, generate third data with a second length by converting second data corresponding to the first length information, the second length being shorter than a first length indicated by the first length information, generate second weight data by decompressing the third data with the second length, and perform a machine learning-based operation based on the first weight data and the second weight data.

20. The method of claim 19, further comprising:

simultaneously programming the two or more DMA masters using a second start address and second length information; and reading, at the at least two or more DMA masters, next data from the memory in parallel based on the second start address and the second length information and transferring the next data read in parallel to the machine learning accelerator.

* * * * *